(12) United States Patent
Osada

(10) Patent No.: US 6,784,780 B2
(45) Date of Patent: Aug. 31, 2004

(54) COUPLING ADJUSTING STRUCTURE FOR DOUBLE-TUNED CIRCUIT

(75) Inventor: Shigeru Osada, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 34 days.

(21) Appl. No.: 10/217,557

(22) Filed: Aug. 13, 2002

(65) Prior Publication Data

US 2003/0034868 A1 Feb. 20, 2003

(30) Foreign Application Priority Data

Aug. 20, 2001 (JP) .......................................... 2001-249508
Aug. 20, 2001 (JP) .......................................... 2001-249509

(51) Int. Cl.[7] ................................................. H01F 5/00
(52) U.S. Cl. ...................... 336/200; 336/65; 336/180; 336/182; 336/232; 174/265
(58) Field of Search ......................... 336/200, 65, 180, 336/182, 232, 83, 87, 84, 131; 174/265, 260; 333/73

(56) References Cited

U.S. PATENT DOCUMENTS 3,836,881 A * 9/1974 Koizumi ....................... 336/87
5,777,277 A * 7/1998 Inagawa ...................... 174/265

FOREIGN PATENT DOCUMENTS

| DE | 132 226 | 9/1978 |
| EP | 0 497 556 | 8/1992 |
| JP | 01 135 234 | 5/1989 |
| JP | 04-245410 | 9/1992 |
| JP | 04 290 005 | 10/1992 |
| JP | 10-303 026 | 11/1998 |
| JP | 10303026 | * 11/1998 |

* cited by examiner

Primary Examiner—Lincoln Donovan
Assistant Examiner—Jennifer A. Poker
(74) Attorney, Agent, or Firm—Brinks Hofer Gilson & Lione

(57) ABSTRACT

A coupling adjusting structure for a double-tuned circuit contains first and second coils that are configured such that a pair of first conductive patterns formed on a first surface of a printed circuit and a corresponding pair of second conductive patterns formed on a second surface of the printed circuit board are connected via corresponding connecting conductors. One end of the first coil and the corresponding end of the second coil are disposed close to each other. A first ground conductive pattern is disposed at least on the first surface of the printed circuit. A first jumper connected to the first ground conductive pattern is disposed between the first and second coils to adjust an inductive coupling of the double-tuned circuit.

4 Claims, 6 Drawing Sheets

COUPLING ADJUSTING STRUCTURE FOR DOUBLE-TUNED CIRCUIT

BACKGROUND OF THE INVENTION

1. Field of the Invention

The present invention relates to a coupling adjusting structure for a double-tuned circuit which is suitably used for a TV tuner and the like.

2. Description of the Related Art

A configuration of a known coupling adjusting structure for a double-tuned circuit will be described with reference to FIG. 11. A printed circuit board 51 has a variety of electrical components (not shown) disposed thereon including first and second tuned circuits 52 and 53 formed side by side.

First and second coils 54 and 55 serving as a part of the first and second tuned circuits 52 and 53 have windings 54a and 55a formed by winding wires, and two pairs of fixing legs 54b and 55b disposed at the ends of the windings 54a and 55a, respectively.

The first and second coils 54 and 55 are configured such that the windings 54a and 55a are mounted on the printed circuit board 51 in an upright manner while being close to each other, and the fixing legs 54b and 55b are passed through the printed circuit board 51 and soldered to corresponding conductive patterns (not shown) formed on the lower surface of the printed circuit board 51.

In the double-tuned circuit having such a configuration, an inductive coupling is adjusted by deforming free corresponding ends of the mutually opposing windings 54a and 55a of the first and second coils 54 and 55 in the opposing directions indicated by the arrows Z in the figure.

The known coupling adjusting structure for a double-tuned circuit is configured such that the windings 54a and 55a are disposed in an upright manner against the printed circuit board 51 so as to deform a part of each of the windings 54a and 55a of the first and second coils 54 and 55, respectively, giving rise to a problem in that the double-tuned circuit is tall.

SUMMARY OF THE INVENTION

Accordingly, it is an object of the present invention to provide a thin and easily-adjustable coupling adjusting structure for a double-tuned circuit.

In view of the above described problem, according to one aspect of the present invention, a coupling adjusting structure for a double-tuned circuit, comprises: a printed circuit board; a first tuned circuit comprising a first coil formed by a combination of first and second conductive patterns formed on first and second surfaces of the printed circuit board, respectively; and a second tuned circuit comprising a second coil formed by another combination of other first and second conductive patterns formed on the first and second surfaces of the printed circuit board, respectively. The first and second coils are configured such that the first conductive patterns formed on the first surface of the printed circuit board and the corresponding second conductive patterns formed on the second surface of the printed circuit board are connected to each other via corresponding connecting conductors, one end of the first coil and the corresponding end of the second coil are disposed close to each other, at least one first ground conductive pattern is disposed at least on the first surface of the printed circuit board, and at least one first jumper connected to the first ground conductive pattern is disposed between the first and second coils so as to adjust an inductive coupling of the double-tuned circuit.

In the coupling adjusting structure for a double-tuned circuit, a first island conductive pattern which is out of conduction with the first ground conductive pattern is preferably provided between the first and second coils and on the first surface of the printed circuit, and the first jumper is preferably connected to the first ground conductive pattern and the first island conductive pattern.

Also, in the coupling adjusting structure for a double-tuned circuit, at least one second ground conductive pattern and a second island conductive pattern which lies between the first and second coils and which is out of conduction with the second ground conductive pattern are preferably provided on the second surface of the printed circuit board, the first and second ground conductive patterns are preferably connected to each other via a conductor, and the first and second island conductive patterns are preferably connected to each other via another conductor.

In addition, in the coupling adjusting structure for a double-tuned circuit, at least one second jumper is preferably connected to the second ground conductive pattern and the second island conductive pattern so as to adjust the inductive coupling.

According to another aspect of the present invention, a coupling adjusting structure for a double-tuned circuit comprises: a printed circuit board; a first tuned circuit comprising a first coil formed by a combination of first and second conductive patterns formed on first and second surfaces of the printed circuit board, respectively; and a second tuned circuit comprising a second coil formed by another combination of other first and second conductive patterns formed on the first and second surfaces of the printed circuit board, respectively. The first and second coils are configured such that the first conductive patterns formed on the first surface of the printed circuit board and the corresponding second conductive patterns formed on the second surface of the printed circuit board are connected to each other via corresponding connecting conductors, one end of the first coil and the corresponding end of the second coil are disposed close to each other, at least one first ground conductive pattern comprising a first adjusting conductive pattern extending between the first and second coils is disposed at least on the first surface of the printed circuit board, and the first adjusting conductive pattern is cut off by at least one first break so as to adjust an inductive coupling of the double-tuned circuit.

In the coupling adjusting structure for a double-tuned circuit, at least one second ground conductive pattern comprising a second adjusting conductive pattern extending between the first and second coils is preferably provided on the second surface of the printed circuit board, and the first and second ground conductive patterns are preferably connected to each other via a conductor.

Also, in the coupling adjusting structure for a double-tuned circuit, the second adjusting conductive pattern is preferably cut off by at least one second break so as to adjust the inductive coupling.

DESCRIPTION OF THE PREFERRED EMBODIMENTS

Figure 1:
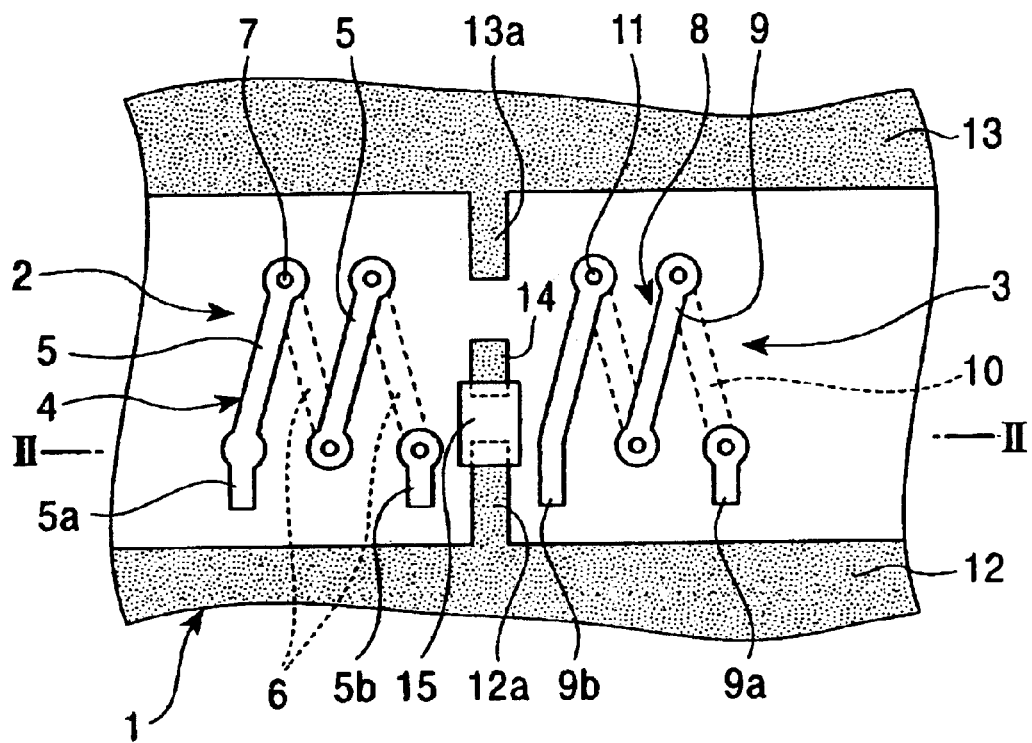
FIG. 1 is a plan view of a coupling adjusting structure for a double-tuned circuit according to a first embodiment of the present invention.
Figure 2:
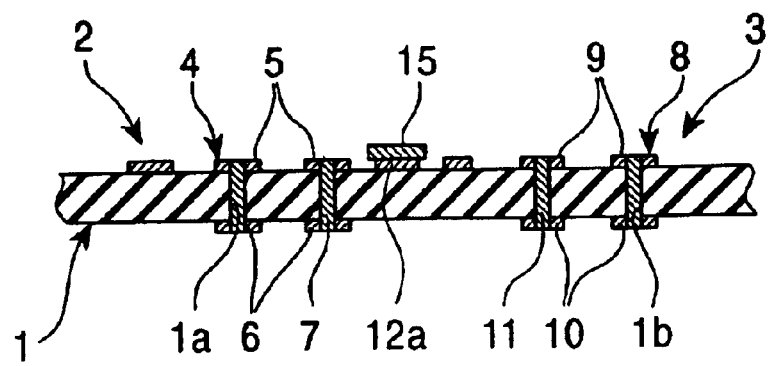
FIG. 2 is a sectional view taken along the line II—II indicated in FIG. 1.
Figure 3:
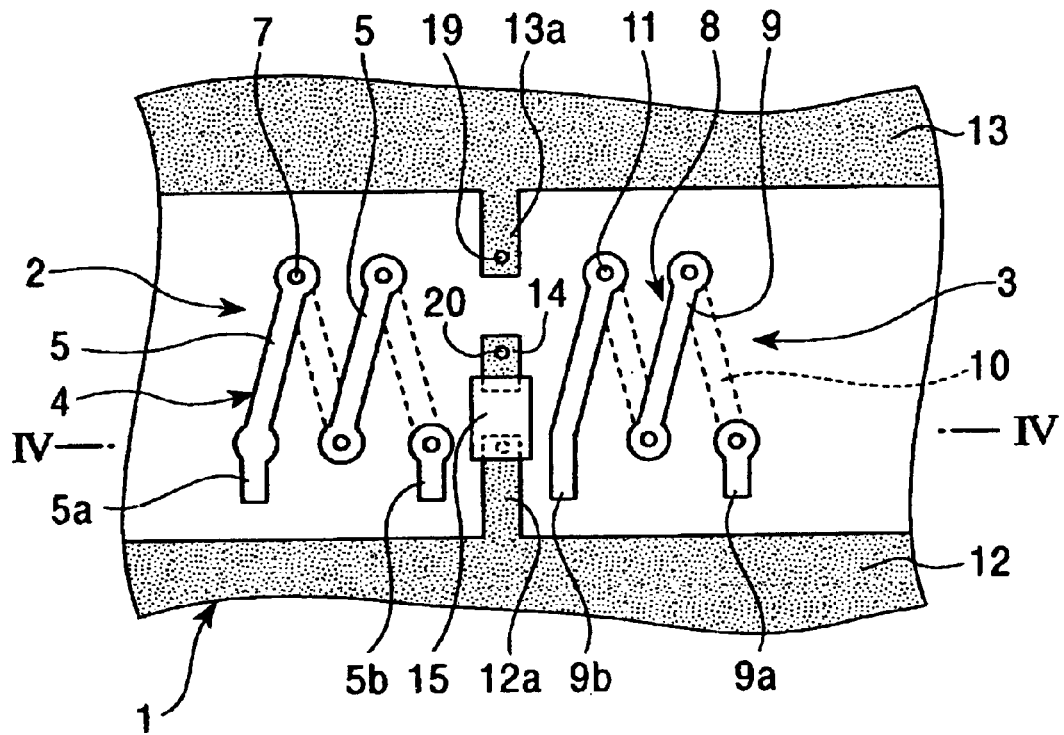
FIG. 3 is a plan view of another coupling adjusting structure for a double-tuned circuit according to a second embodiment of the present invention.
Figure 4:
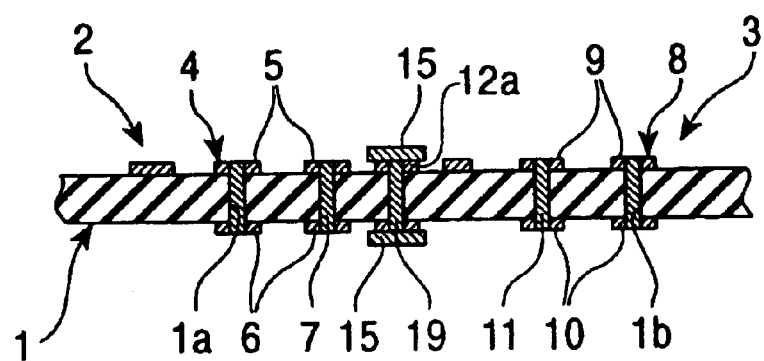
FIG. 4 is a sectional view taken along the line IV—IV indicated in FIG. 3.
Figure 5:
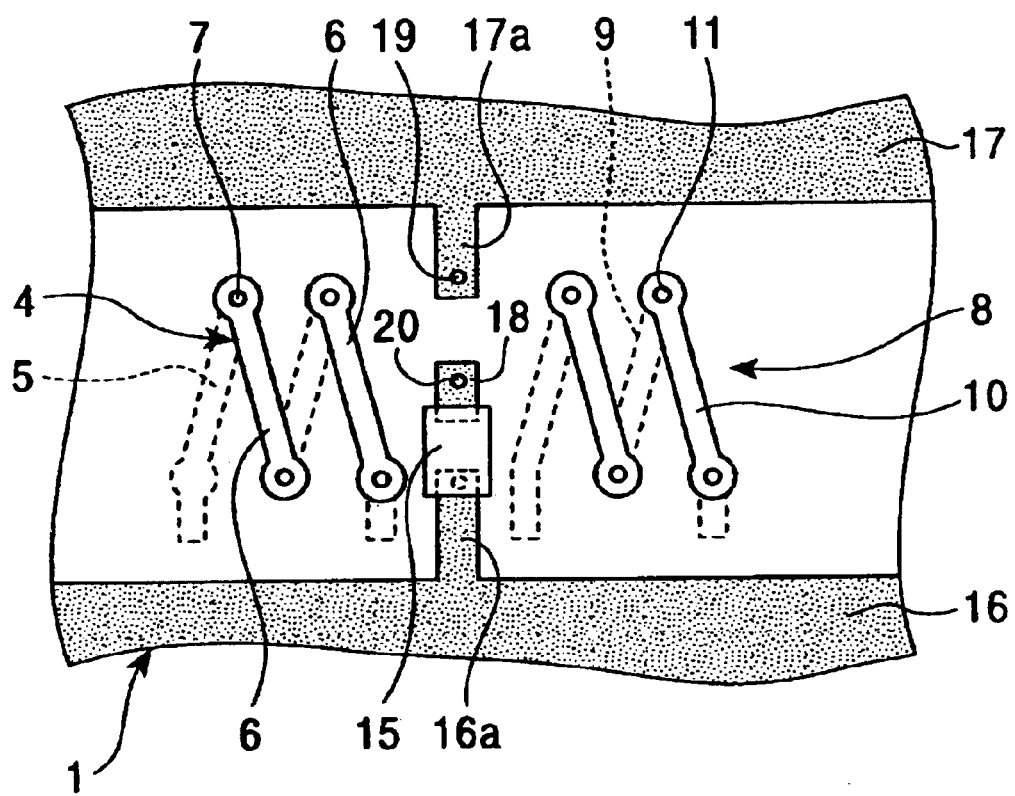
FIG. 5 is a bottom view of the other coupling adjusting structure for a double-tuned circuit according to the second embodiment.

The drawings of the coupling adjusting structures for a double-tuned circuit according to the present invention will be briefly described. FIG. 1 is a plan view of a coupling adjusting structure for a double-tuned circuit according to a first embodiment of the present invention. FIG. 2 is a sectional view of the coupling adjusting structure taken along the line II—II indicated in FIG. 1. FIG. 3 is a plan view of another coupling adjusting structure for a double-tuned circuit according to a second embodiment of the present invention. FIG. 4 is a sectional view of the other coupling adjusting structure taken along the line IV—IV indicated in FIG. 3. FIG. 5 is a bottom view of the other coupling adjusting structure for a double-tuned circuit according to the second embodiment.

Referring now to FIGS. 1 and 2, the coupling adjusting structure for a double-tuned circuit according to the first embodiment will be described. A printed circuit board 1 is formed from a flat insulating plate and has a variety of electrical components (not shown) disposed thereon including first and second tuned circuits 2 and 3 formed side by side.

A first coil 4 serving as a part of the first tuned circuit 2 has first conductive patterns 5 formed on a first surface of the printed circuit board 1, second conductive patterns 6 formed on a second surface of the printed circuit board 1, through-holes 1a perforated in the printed circuit board 1 so as to lie at mutually opposing ends of the first and second conductive patterns 5 and 6, and connecting conductors 7 filled in the through-holes 1a so as to connect the corresponding ends of the first and second conductive patterns 5 and 6 to each other.

The first coil 4 is configured in a zigzag manner by the first and second conductive patterns 5 and 6. Also, the first conductive patterns 5 have end portions 5a and 5b, both connected to the first tuned circuit 2.

A second coil 8 serving as a part of the second tuned circuit 3 has first conductive patterns 9 formed on the first surface of the printed circuit board 1, second conductive patterns 10 formed on the second surface of the printed circuit board 1, through-holes 1b perforated in the printed circuit board 1 so as to lie at mutually opposing ends of the first and second conductive patterns 9 and 10, and connecting conductors 11 filled in the through-holes 1b so as to connect the corresponding ends of the first and second conductive patterns 9 and 10 to each other.

The second coil 8 is configured in a zigzag manner by the first and second conductive patterns 9 and 10. Also, the first conductive patterns 9 have end portions 9a and 9b, both connected to the second tuned circuit 3.

Furthermore, one end of the first coil 4 and the corresponding end of the second coil 8 are disposed close to each other.

In addition, there are provided on the first surface of the printed circuit board 1 a pair of first ground conductive patterns 12 and 13 so as to sandwich the first and second coils 4 and 8, protruding conductive patterns 12a and 13a respectively extending from the first ground conductive patterns 12 and 13 so as to lie between the first and second coils 4 and 8, and a first island conductive pattern 14 which is disposed between the protruding conductive patterns 12a and 13a and which is out of conduction with the first ground conductive patterns 12 and 13.

A first jumper 15 made from a conductor such as a metal plate or a metal wire is disposed by soldering so as to connect the protruding conductive pattern 12a of the first ground conductive pattern 12 and the first island conductive pattern 14.

The first jumper 15 is disposed between the first and second coils 4 and 8 so as to adjust an inductive coupling between the first and second coils 4 and 8.

Although not shown in the figures, another first jumper 15 may be disposed so as to connect the protruding conductive pattern 13a of the first ground conductive pattern 13 and the first island conductive pattern 14 as required.

More particularly, the inductive coupling of the double-tuned circuit having such a configuration is adjusted such that the degree of coupling between the first and second coils 4 and 8 is reduced by disposing the first jumper 15 between the first and second coils 4 and 8.

FIGS. 3 to 5 illustrate the other coupling adjusting structure for a double-tuned circuit according to the second embodiment of the present invention. In the second embodiment, a pair of second ground conductive patterns 16 and 17 having protruding conductive patterns 16a and 17a, respectively, which extend between the first and second coils 4 and 8, and also a second island conductive pattern 18 lying between the protruding conductive patterns 16a and 17a are provided on the second surface of the printed circuit board 1.

The first ground conductive patterns 12 and 13 formed on the first surface of the printed circuit board 1 are respectively connected to the second ground conductive patterns 16 and 17 formed on the second surface of the printed circuit board 1 via corresponding conductors 19, and also the first and second island conductive patterns 14 and 18 respectively disposed on the first and second surfaces of the printed circuit board 1 are connected to each other via a conductor 20.

The inductive coupling of the double-tuned circuit is adjusted by disposing a second jumper 15 so as to connect the protruding conductive pattern 16a and the second island conductive pattern 18 and/or by disposing another second jumper 15 so as to connect the protruding conductive pattern 17a and the second island conductive pattern 18.

Since the other configuration is the same as that in the first embodiment, like parts are denoted by the same reference numerals and their description is omitted.

By disposing the first and second jumpers 15 on both surfaces of the printed circuit board 1 as in the second embodiment, the inductive coupling can be adjusted in a further wider range.

Figure 6:
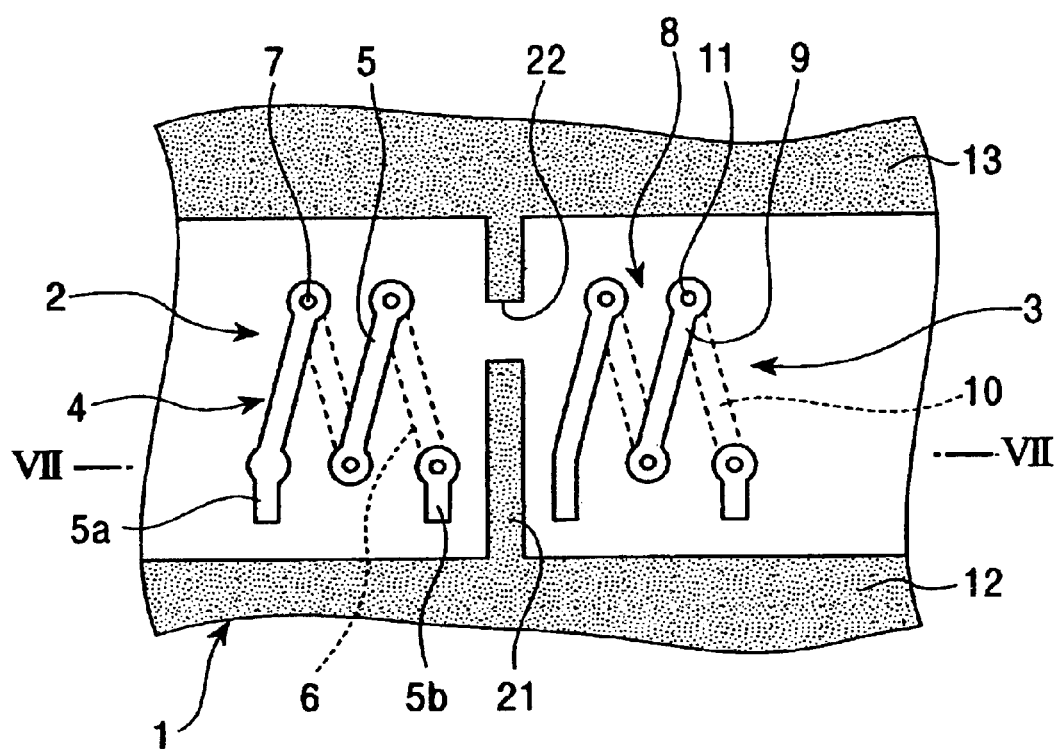
FIG. 6 is a plan view of another coupling adjusting structure for a double-tuned circuit according to a third embodiment of the present invention.
Figure 7:
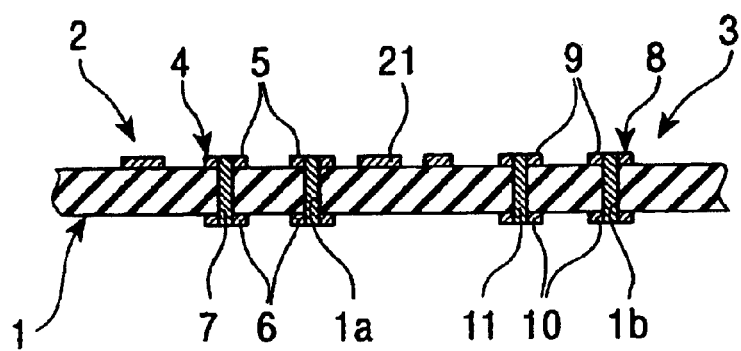
FIG. 7 is a sectional view taken along the line VII—VII indicated in FIG. 6.
Figure 8:
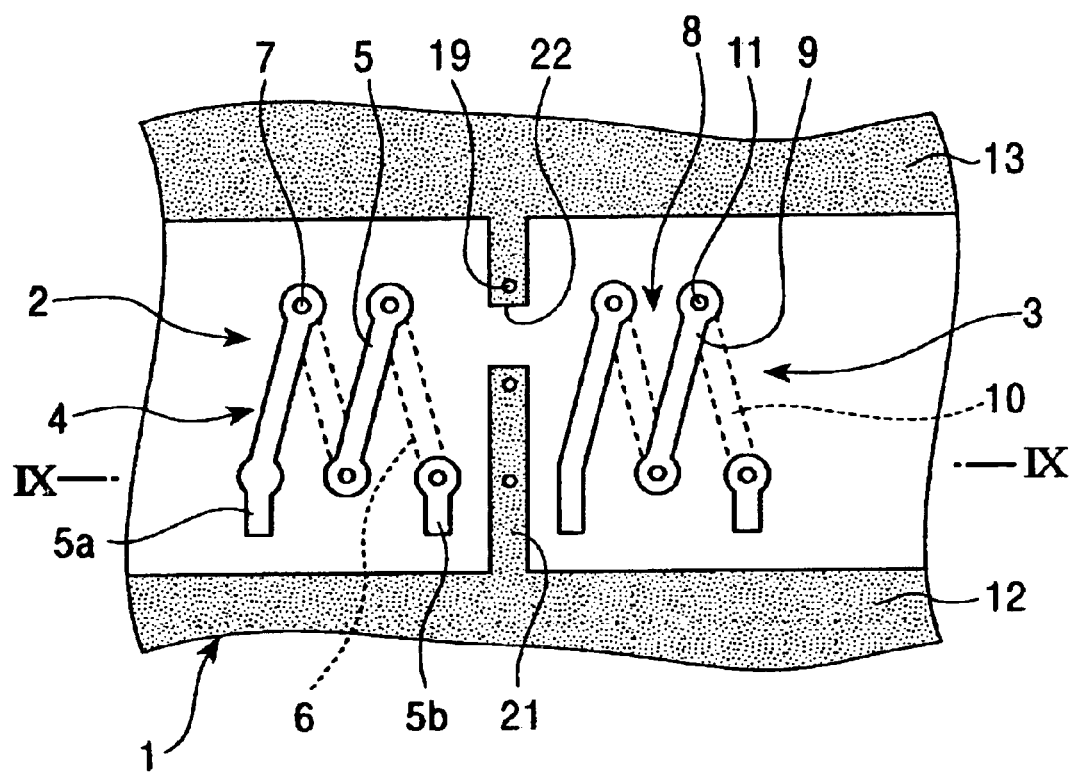
FIG. 8 is a plan view of another coupling adjusting structure for a double-tuned circuit according to a fourth embodiment of the present invention.
Figure 9:
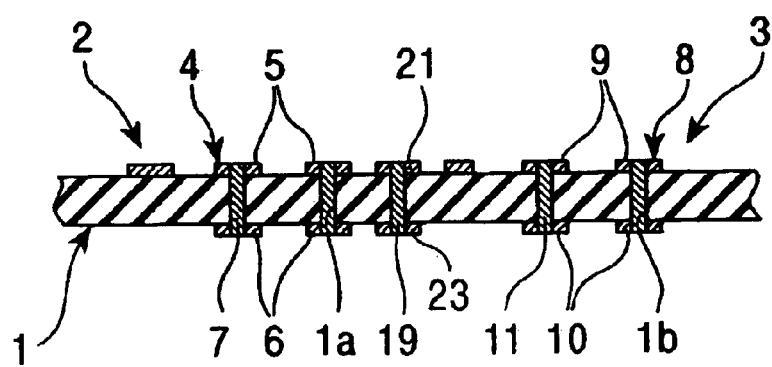
FIG. 9 a sectional view taken along the line IX—IX indicated in FIG. 8.
Figure 10:
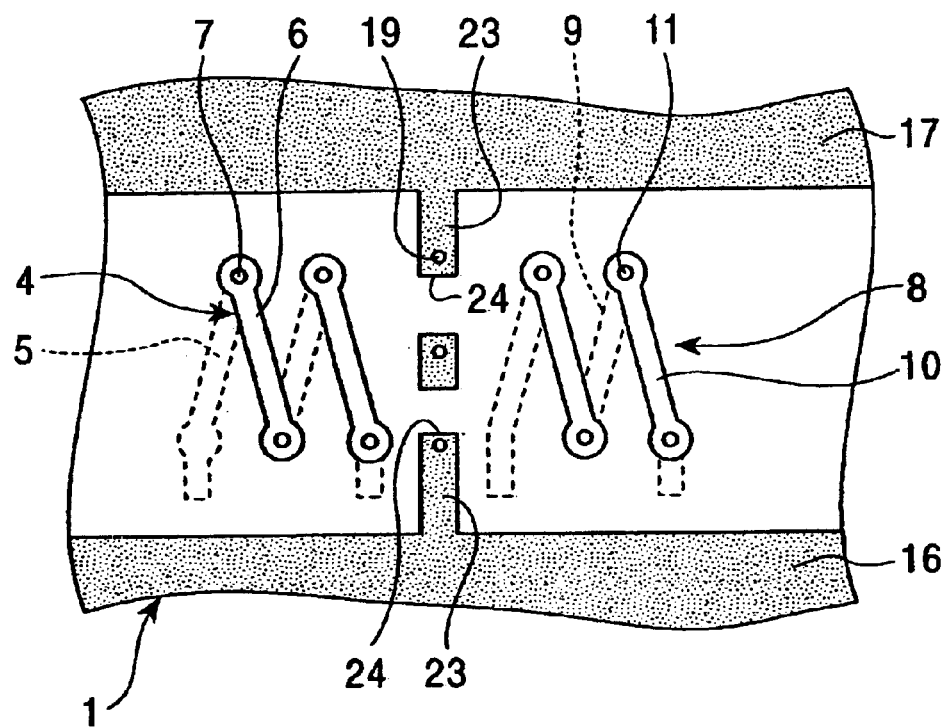
FIG. 10 is a bottom view of the other coupling adjusting structure for a double-tuned circuit according to the fourth embodiment.
Figure 11:
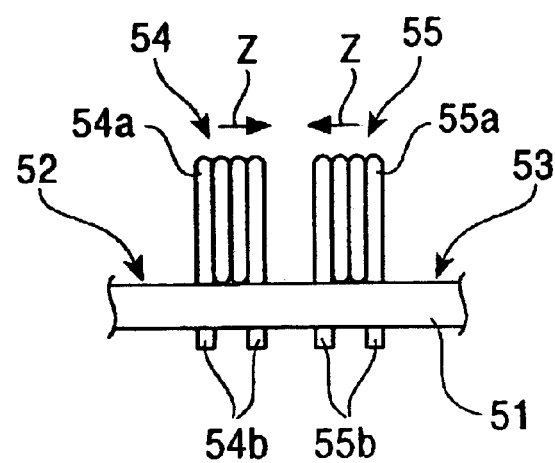
FIG. 11 is an elevation view of a known coupling adjusting structure for a double-tuned circuit.

FIG. 6 is a plan view of another coupling adjusting structure for a double-tuned circuit according to a third embodiment of the present invention. FIG. 7 is a sectional view of the other coupling adjusting structure taken along the line VII—VII indicated in FIG. 6. FIG. 8 is a plan view of another coupling adjusting structure for a double-tuned circuit according to a fourth embodiment of the present invention. FIG. 9 is a sectional view of the other coupling adjusting structure taken along the line IX—IX indicated in FIG. 8. FIG. 10 is a bottom view of the other coupling adjusting structure for a double-tuned circuit according to the fourth embodiment.

Referring now to FIGS. 6 and 7, the coupling adjusting structure for a double-tuned circuit according to the third embodiment will be described. The printed circuit board 1 is formed from a flat insulating plate and has a variety of electrical components (not shown) disposed thereon including the first and second tuned circuits 2 and 3 formed side by side.

The first coil 4 serving as a part of the first tuned circuit 2 has the first conductive patterns 5 formed on the first surface of the printed circuit board 1, the second conductive patterns 6 formed on the second surface of the printed circuit board 1, the through-holes 1a perforated in the printed circuit board 1 so as to lie at the mutually opposing ends of the first and second conductive patterns 5 and 6, and the connecting conductors 7 filled in the through-holes 1a so as to connect the corresponding ends of the first and second conductive patterns 5 and 6 to each other.

The first coil 4 is configured in a zigzag manner by the first and second conductive patterns 5 and 6. Also, the first conductive patterns 5 have the end portions 5a and 5b, each connected to the first tuned circuit 2.

The second coil 8 serving as a part of the second tuned circuit 3 has the first conductive patterns 9 formed on the first surface of the printed circuit board 1, the second conductive patterns 10 formed on the second surface of the printed circuit board 1, the through-holes 1b perforated in the printed circuit board 1 so as to lie at the mutually opposing ends of the first and second conductive patterns 9 and 10, and the connecting conductors 11 filled in the through-holes 1b so as to connect the corresponding ends of the first and second conductive patterns 9 and 10 to each other.

The second coil 8 is configured in a zigzag manner by the first and second conductive patterns 9 and 10. Also, the first conductive patterns 9 have the end portions 9a and 9b, each connected to the second tuned circuit 3.

Furthermore, one end of the first coil 4 and the corresponding end of the second coil 8 are disposed close to each other.

In addition, the pair of first ground conductive patterns 12 and 13 are provided so as to sandwich the first and second coils 4 and 8, and also a first adjusting conductive pattern 21 extending from the first ground conductive patterns 12 and 13 is provided so as to lie between the first and second coils 4 and 8, both on the first surface of the printed circuit board 1.

More particularly, in the double-tuned circuit having such a configuration, the inductive coupling of the double-tuned circuit is adjusted such that the degree of coupling between the first and second coils 4 and 8 is increased by disposing a first break 22 which cuts off the first adjusting conductive pattern 21 lying between the first and second coils 4 and 8.

Although the first break 22 is provided at a single location in FIG. 6, the inductive coupling may be adjusted by providing a plurality of the breaks 22 for cutting the first adjusting conductive pattern 21 at a plurality of locations.

FIGS. 8 to 10 illustrate the other coupling adjusting structure for a double-tuned circuit according to the fourth embodiment of the present invention. In the fourth embodiment, the other pair of second ground conductive patterns 16 and 17 having a second adjusting conductive pattern 23 which lies between the first and second coils 4 and 8 are provided on the second surface of the printed circuit board 1, and the first ground conductive patterns 12 and 13 formed on the first surface of the printed circuit board 1 are respectively connected to the second ground conductive patterns 16 and 17 formed on the second surface via the corresponding conductors 19.

The inductive coupling for a double-tuned circuit is adjusted such that the degree of coupling is increased by providing at least one second break 24 for cutting off the second adjusting conductive pattern 23, at least one location, lying between the first and second coils 4 and 8.

Since the other configuration is the same as that in the third embodiment, like parts are denoted by the same reference numerals and their description is omitted.

By disposing the first and second adjusting conductive patterns 21 and 23 on both surfaces of the printed circuit board 1 as in the fourth embodiment, the inductive coupling can be adjusted in a further wider range.

In accordance with the coupling adjusting structure for a double-tuned circuit according to the present invention, the first and second coils 4 and 8 are formed by connecting the first conductive patterns 5 and 9 formed on the first surface of the printed circuit board 1 to the second conductive patterns 6 and 10 formed on the second surface of the printed circuit board 1 via the connecting conductors 7 and 11, respectively, thereby making the first and second coils 4 and 8 lower and thinner. Also, the first ground conductive pattern 12 is disposed at least on the first surface of the printed circuit board 1 and the first jumper 15 connected to the first ground conductive pattern 12 is disposed between the first and the second coils 4 and 8 so as to adjust the inductive coupling, while one end of the first coil 4 and the corresponding end of the second coil 8 are disposed close to each other, thereby achieving a double-tuned circuit which can adjust the inductive coupling.

In addition, on the first surface of the printed circuit board 1, the first island conductive pattern 14, which is out of conduction with the first ground conductive patter 12, is formed between the first and second coils 4 and 8, and the first jumper 15 is connected to the first ground conductive pattern 12 and the first island conductive pattern 14, thereby achieving the first jumper 15 which can be connected easily and has a large strength of connection.

Furthermore, the second ground conductive pattern 16 and the second island conductive pattern 18, which lies between the first and second coils 4 and 8 and is out of conduction with the second ground conductive pattern 16, are provided on the second surface of the printed circuit board 1, the first and second ground conductive patterns 12 and 16 are connected to each other via the corresponding conductor 19, and also the first and second island conductive patterns 14 and 18 are connected to each other via the conductor 20, whereby each of the former and latter groups of the connected conductive patterns has the same electric potential and also the inductive couplings can be adjusted on both surfaces of the printed circuit board 1.

Moreover, the second ground conductive pattern 16 and the second island conductive pattern 18 are connected to each other via the second jumper 15 so as to adjust the inductive coupling, thereby achieving the second jumper 15 which can be connected easily and has a large strength of connection, and allowing the inductive coupling to be adjusted in a wider range.

In accordance with the coupling adjusting structure for a double-tuned circuit according to the present invention, the first and second coils 4 and 8 are formed such that the first conductive patterns 5 and 9 formed on the first surface of the printed circuit board 1 and the second conductive patterns 6 and 10 formed on the second surface of the printed circuit board 1 are respectively connected to each other via the connecting conductors 7 and 11, thereby making the first and second coils 4 and 8 lower and thinner. Also, the first adjusting conductive pattern 21 connected to the first ground conductive pattern 12 is disposed at least on the first surface of the printed circuit board 1 and the first adjusting conductive pattern 21 is cut off by the first break 22 so as to adjust the inductive coupling, while one end of the first coil 4 is disposed close to the corresponding end of the second coil 8, thereby achieving a double-tuned circuit whose inductive coupling can be easily adjusted.

In addition, the second ground conductive pattern 16 is provided on the second surface of the printed circuit board 1, and the first and second ground conductive patterns 12 and 16 are connected to each other via the corresponding conductor 19, whereby each of the connected conductive patterns and conductor has the same electric potential and also the inductive couplings can be adjusted on both surfaces of the printed circuit board 1.

Furthermore, the second adjusting conductive pattern 23 is cut off by the second break 24 so as to adjust the inductive coupling, thereby allowing the inductive coupling to be adjusted in a further wider range.

What is claimed is:

1. A coupling adjusting structure for a double-tuned circuit, comprising:

a printed circuit board;

a first tuned circuit comprising a first coil formed by a combination of first and second conductive patterns formed on first and second surfaces of the printed circuit board, respectively; and a second tuned circuit comprising a second coil formed by a combination of third and fourth conductive patterns formed on the first and second surfaces of the printed circuit board, respectively, wherein the first coils is configured such that the first conductive patterns formed on the first surface of the printed circuit board and the second conductive patterns formed on the second surface of the printed circuit board are connected to each other via first connecting conductors, the second coil is configured such that the third conductive pattern formed on the first surface of the printed circuit board and the fourth conductive pattern formed on the second surface of the printed circuit board are connected to each other via second connecting conductors, the first coil and the second coil are disposed close to each other with a gap therebetween so that inductive coupling is provided, at least one first ground conductive pattern is disposed at least on the first surface of the printed circuit board, the first ground conductive pattern has a first protruding conducting pattern which extends through the gap, and at least one first jumper connected to the first protruding conductive pattern is disposed between the first and second coils so as to adjust the inductive coupling of the double-tuned circuit.

2. The coupling adjusting structure for a double-tuned circuit according to claim 1, wherein a first island conductive pattern which is electrically isolated from the first ground conductive pattern is provided between the first and second coils and on the first surface of the printed circuit, and the first jumper is connected to the first protruding conductive pattern and the first island conductive pattern.

3. The coupling adjusting structure for a double-tuned circuit according to claim 2, wherein at least one second ground conductive pattern and a second island conductive pattern which lies between the first and second coils and which is out of conduction with the second ground conductive pattern are provided on the second surface of the printed circuit board, the first and second ground conductive patterns are connected to each other via a conductor, and the first and second island conductive patterns are connected to each other via another conductor.

4. The coupling adjusting structure for a double-tuned circuit according to claim 3, wherein at least one second jumper is connected to the second ground conductive pattern and the second island conductive pattern so as to adjust the inductive coupling.

* * * * *